United States Patent
Stockinger et al.

(10) Patent No.: US 9,219,452 B2
(45) Date of Patent: Dec. 22, 2015

(54) DUAL MODE RECEIVER WITH RF SPLITTER USING PROGRAMMABLE PASSIVE COMPONENTS

(75) Inventors: Herbert Stockinger, Schliersee (DE); Umut Basaran, Unterhaching (DE); Josef Schmal, Aying (DE); Ashkan Naeini, Munich (DE)

(73) Assignee: Intel Deutschland GmbH, Neubiberg (DE)

( * ) Notice: Subject to any disclaimer, the term of this patent is extended or adjusted under 35 U.S.C. 154(b) by 577 days.

(21) Appl. No.: 13/477,519

(22) Filed: May 22, 2012

(65) Prior Publication Data
US 2013/0316671 A1 Nov. 28, 2013

(51) Int. Cl.
H04B 1/16 (2006.01)
H03F 3/45 (2006.01)
H04B 1/18 (2006.01)

(52) U.S. Cl.
CPC ........ *H03F 3/45475* (2013.01); *H03F 3/45179* (2013.01); *H04B 1/18* (2013.01); *H03F 2200/294* (2013.01); *H03F 2203/45384* (2013.01)

(58) Field of Classification Search
CPC .............. H04B 1/18; H04B 1/10; H03B 5/08; H03F 3/68
USPC ............... 455/341, 296, 127.3, 144, 291, 311
See application file for complete search history.

(56) References Cited

U.S. PATENT DOCUMENTS

| | | | |
|---|---|---|---|
| 6,801,760 B2* | 10/2004 | Hutchison et al. ......... | 455/127.3 |
| 7,098,737 B2 | 8/2006 | Fujimoto et al. | |
| 7,202,754 B2 | 4/2007 | Komurasaki et al. | |
| 7,456,697 B2* | 11/2008 | Lee et al. ................... | 331/117 R |
| 7,486,135 B2* | 2/2009 | Mu .................................. | 330/51 |
| 8,611,844 B2* | 12/2013 | Su et al. ......................... | 455/341 |
| 2003/0146799 A1 | 8/2003 | Muramatsu et al. | |
| 2006/0071732 A1* | 4/2006 | Komurasaki et al. ......... | 331/167 |
| 2007/0093230 A1* | 4/2007 | Yeh ................................. | 455/341 |
| 2010/0311378 A1* | 12/2010 | Tasic et al. ..................... | 455/296 |
| 2012/0231729 A1* | 9/2012 | Xu et al. ...................... | 455/13.4 |
| 2012/0293259 A1* | 11/2012 | Riekki et al. .................. | 330/253 |
| 2013/0136211 A1* | 5/2013 | Jussila et al. .................. | 375/340 |
| 2013/0316671 A1* | 11/2013 | Stockinger et al. ........... | 455/341 |

OTHER PUBLICATIONS

W.W. Choi, et al., "Microwave Lumped and Transversal Bandpass Filter Using Unequal Source Degeneration Inductors for Noise and Selectivity Improvement", Research Committee of University of Macau, p. 1-4.

(Continued)

*Primary Examiner* — Bobbak Safaipour
*Assistant Examiner* — MD Talukder
(74) *Attorney, Agent, or Firm* — Eschweiler & Associates, LLC

(57) ABSTRACT

One embodiment of the present invention relates to a dual mode receiver that includes an RF splitter configured to operate in two modes, wherein in a first mode a single low noise amplifier is active to receive an RF input signal, and in a second mode two low noise amplifiers are active to receive the RF input signal. The receiver further includes a programmable degeneration component operably coupled to the RF splitter, and configured to provide a first performance characteristic in the first mode, and a second, different performance characteristic in the second mode, wherein the first and second performance characteristics influence an input impedance of the RF splitter to be substantially the same in the first and second modes.

17 Claims, 7 Drawing Sheets

(56) References Cited

OTHER PUBLICATIONS

Luca Daniel, et al., "A Broadband Low-Noise-Amplifier", Department of Electrical Engineering and Computer Sciences, May 1999, p. 1-8.

J.P. Silver, "MOS Common-Source LNA Design Tutorial", www.rfic.co.uk, p. 1-11.

Chunyu Xin, et al., "A GSM LNA Using Mutual-Coupled Degeneration", IEEE Microwave and Wireless Components Letters, vol. 15, No. 2, Feb. 2005, p. 68-70.

\* cited by examiner

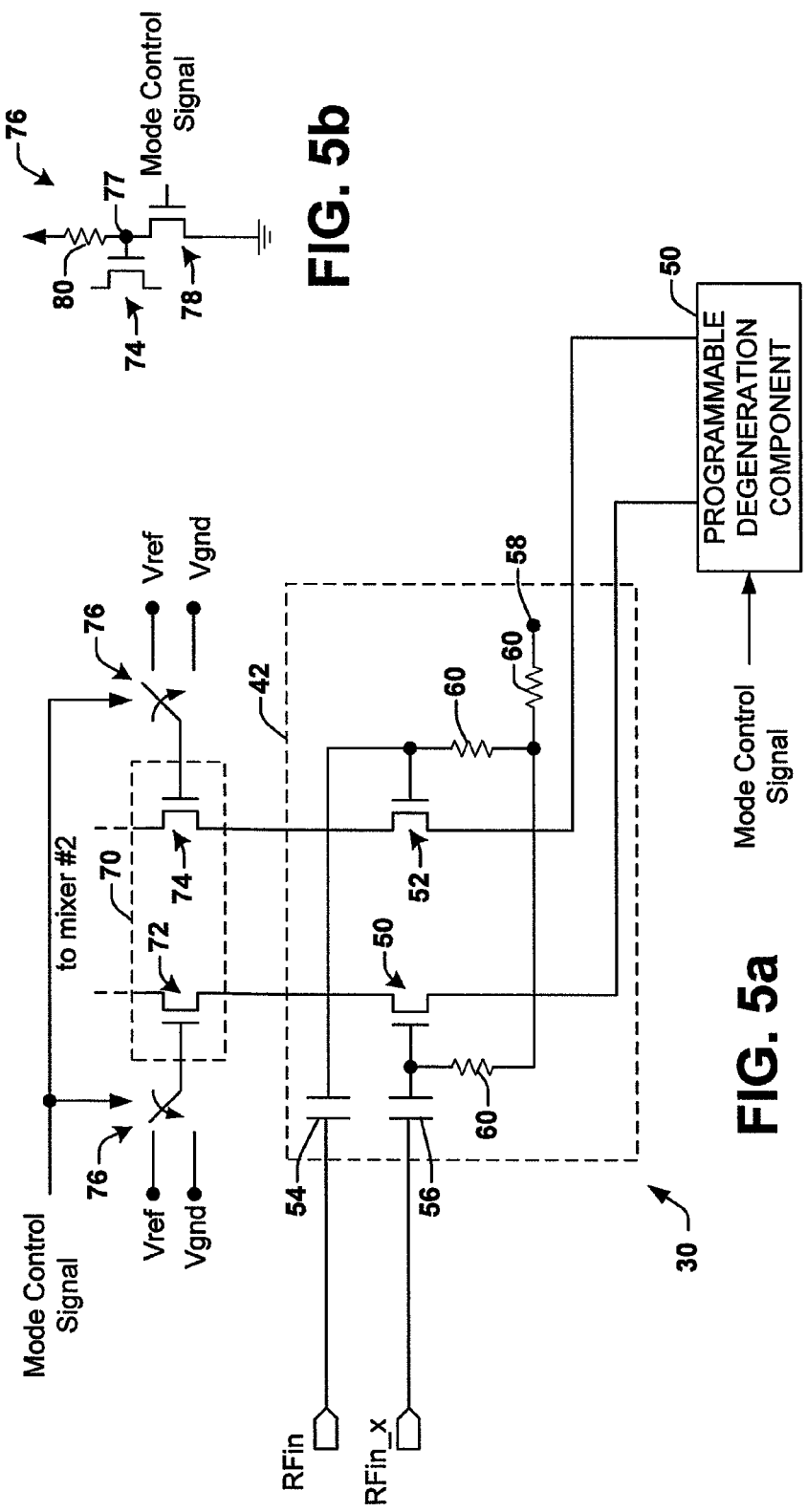

DUAL MODE RECEIVER WITH RF SPLITTER USING PROGRAMMABLE PASSIVE COMPONENTS

BACKGROUND

Communication systems utilize transmitters and receivers to transfer information. Next generation receivers receive data concurrently on separate distinct channels. Accurate receipt of such information is challenging.

BRIEF DESCRIPTION OF THE DRAWINGS

FIG. 5a is a schematic circuit diagram illustrating one of the low noise amplifier circuits of FIG. 4 having a cascode circuit arrangement at an output thereof that illustrates how a deactivation of the cascode circuit arrangement can be employed to deactivate the low noise amplifier according to one embodiment of the disclosure.

FIG. 5b is a schematic circuit diagram illustrating a switching circuit for activating and deactivating a cascode stage associated with an LNA according to one embodiment of the disclosure.

DETAILED DESCRIPTION

The present invention includes a receiver circuit employing an RF splitter and associated method related to receiving an RF input signal in one of two different modes. In one mode a single receiver chain is active, and in a second mode two parallel receiver chains are active. The low noise amplifiers of the two parallel receiver chains are coupled to a programmable degeneration component that varies a performance characteristic associated therewith such that an input impedance looking into the receiver chain or chains is substantially the same despite whether the receiver is operating in the first or the second operating mode.

Figure 1:
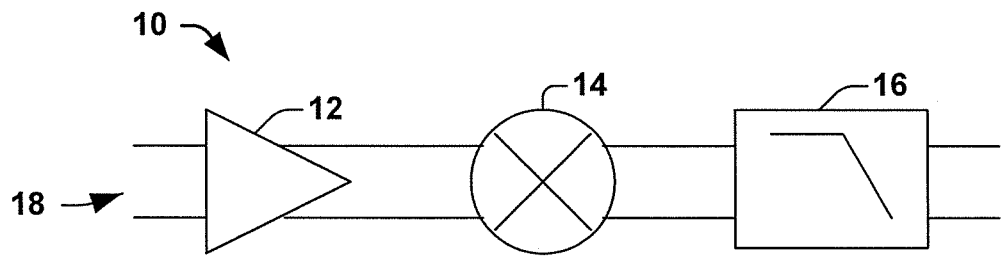
FIG. 1 is a schematic diagram of a front end portion of a receiver circuit.

FIG. 1 is a schematic diagram illustrating a portion of a receiver chain 10. Upstream of the receiver chain portion 10 may reside an antenna terminal configured to couple to an antenna, a duplexer, a filter and potentially other components. The receiver chain portion 10 includes a low noise amplifier circuit 12, a mixer 14, and a low pass filter. 16. The low noise amplifier (LNA) 12 is an electronic amplifier used to amplify potentially weak signals (for example, captured by an antenna). The LNA 12 is a valuable component in the receiver chain 10 which is placed near the front-end of a radio receiver circuit. Using the LNA 12, the effect of noise from subsequent stages of the receive chain is reduced by the gain of the LNA, while the noise of the LNA itself is injected directly into the received signal. Thus, it is desirable for an LNA to boost the desired signal power while adding as little noise and distortion as possible, so that the retrieval of this signal is possible in the later stages in the system.

Still referring to FIG. 1, the received RF input signal 18 is a differential signal and is amplified by the LNA 12 and then down-converted by the mixer 14. While not shown in FIG. 1, the mixer 14 receives a local oscillator (LO) signal from an oscillator circuit (e.g., a voltage controlled oscillator (VCO)). Most mixers simply multiply the RF input signal with the LO signal and keep the low frequency term to generate an analog down-converted signal. Such signal is then low-pass filtered by the low-pass filter (LPF) 16 to suppress any noise.

Figure 2:
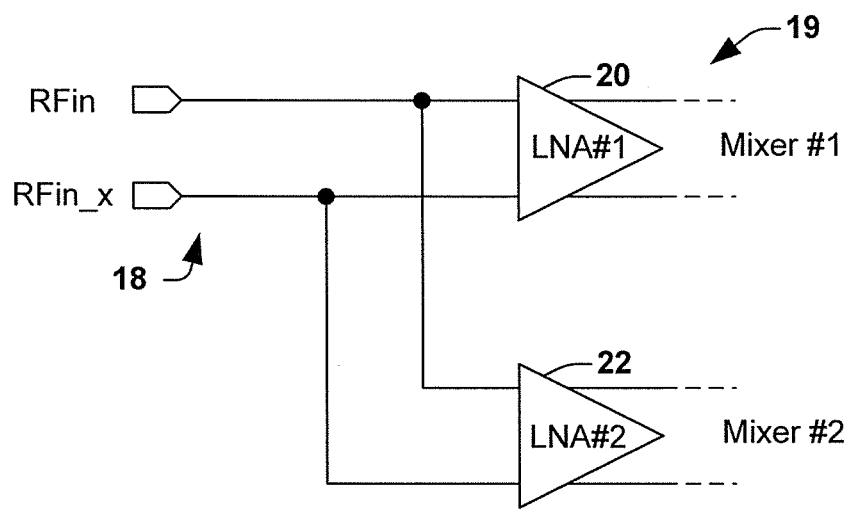
FIG. 2 is a schematic diagram of a portion of a receiver circuit having two parallel paths for different channels.

Turning to FIG. 2, a plurality of parallel-coupled receiver chains is illustrated. In modern receivers, a wide input frequency range for received signals needs to be accommodated to comply with various communication standards. This increases a number of inductors used as a load or source degeneration component in amplifiers with the negative result of a dramatically increased chip area. In addition to increased chip area, the receiver needs to accommodate a larger number of ports proportional to the number of frequency bands that need to be supported, which leads to a larger package size. Finally, increasing the number of ports complicates a routing of the high frequency ports to external components such as duplexers, SAW filters, etc.

FIG. 2 illustrates two parallel coupled receiver chains 19 that both receive the same differential RF input signal (RFin, RFin_x) 18 from upstream receiver components. Thus each LNA 20 and 22 receives the same signal to provide an amplified differential signal for subsequent mixing. In the receiver of FIG. 2, if the second LNA 22 is deactivated, the input impedance seen by the RF input signal at the first LNA 20 substantially changes, thus negatively affecting the noise figure and linearity of the receiver chain.

Figure 3:
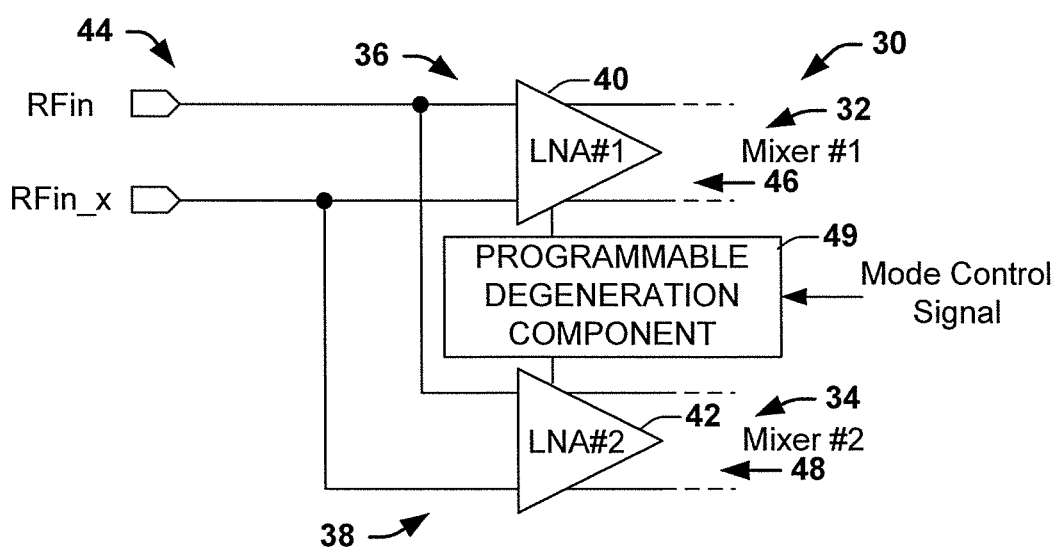
FIG. 3 is a schematic block diagram illustrating a portion of a receiver circuit having two parallel paths that employ a programmable degeneration component to maintain a substantially constant input impedance over two different modes of operation according to one embodiment of the disclosure.

FIG. 3 illustrates a receiver portion or RF splitter circuit 30 according to one embodiment of the disclosure. The receiver portion 30 employs a programmable degeneration component in conjunction with two or more parallel receiver chains to form an RF splitter that exhibits a minimal degradation in noise figure and linearity. In various different modes, a different number of parallel receiver chains are active, and based on the active mode the programmable degeneration component provides a programmable performance characteristic that operates to maintain an input impedance looking into the receiver chain portion 30 substantially constant independent of which operating mode is employed.

FIG. 3 shows a first receiver chain path 32 and a second receiver chain path 34 that are coupled together at their respective inputs 36 and 38 that form an input of a first LNA 40 and a second LNA 42, respectively. Both the first LNA 40 and the second LNA 42 receive the same differential RF input signal 44, and provide a low-noise amplification thereof at their respective outputs 46 and 48 that couple to respective mixers (mixer #1 and mixer #2) downstream thereof. The receiver portion or RF splitter 30 further comprises a programmable degeneration component 50 coupled to both the first LNA 40 and the second LNA 42. The programmable degeneration component 50 operates to provide a programmable performance characteristic associated therewith based on a mode control signal provided thereto.

In a first mode of operation, solely the first LNA 40 is active while the second LNA 42 is inactive. This first mode of operation is reflected by the mode control signal to the programmable degeneration component 49, which provides a first performance characteristic associated therewith to the first LNA 40. In a second mode of operation both the first LNA 40 and the second LNA 42 are active and the second mode of operation is reflected by the mode control signal to the programmable degeneration component 49. In response, the programmable degeneration component 49 provides a second performance characteristic to the first LNA 40 and to the second LNA 42, wherein the second performance characteristic is different than the first performance characteristic. The different performance characteristics are such that the input impedance looking into the receiver portion 30 is substantially the same for both the first mode and the second mode.

While FIG. 3 illustrates solely two parallel-coupled receiver chain paths 32 and 34 and solely two modes of operation, it should be understood that the present disclosure contemplates a plurality of different receiver chains and a plurality of different modes, wherein the programmable degeneration component 49 is configured to provide a different performance characteristic for each of the plurality of different modes, so that the input impedance looking into the receiver portion 30 is substantially the same for all such modes.

Figure 4:
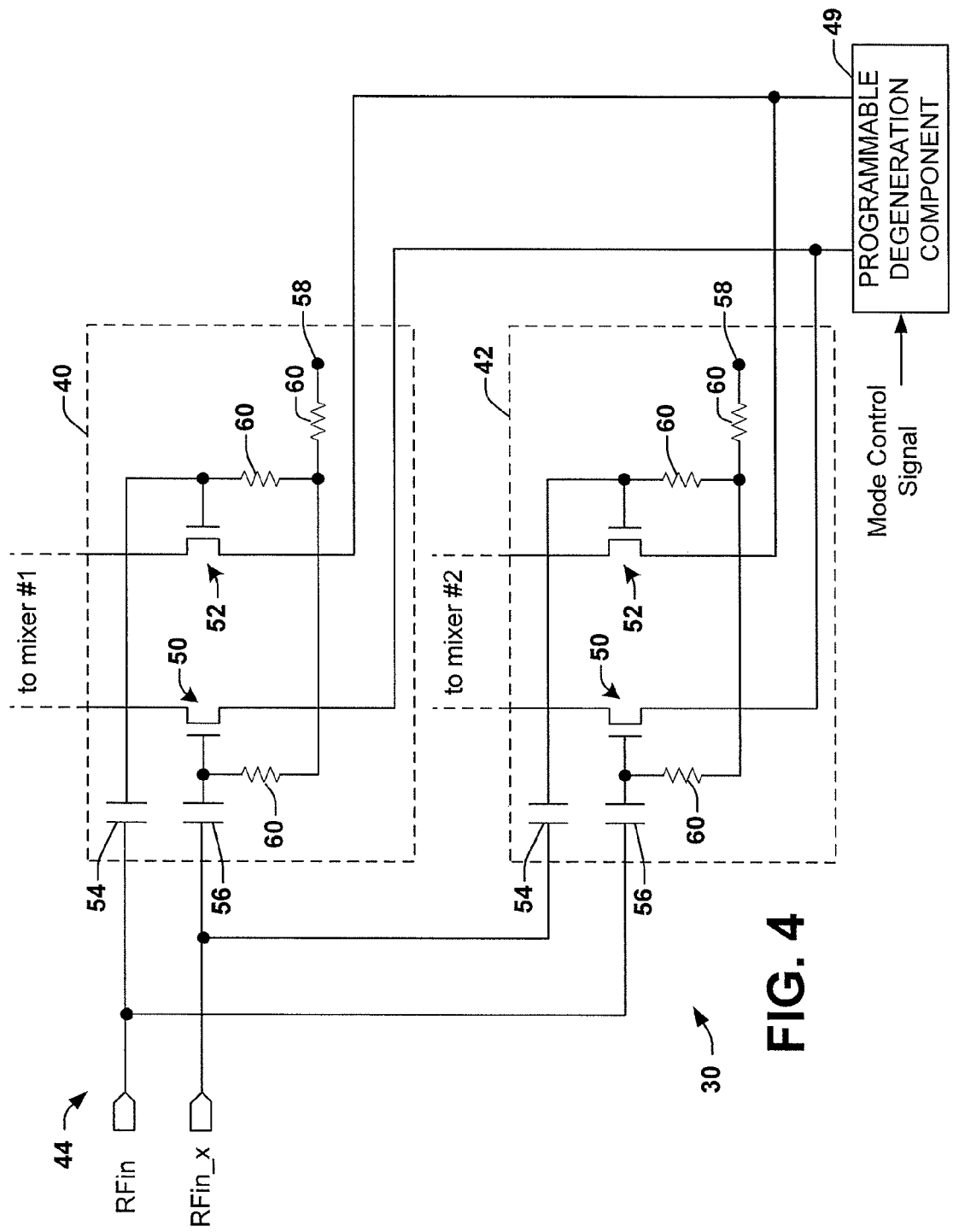
FIG. 4 is a schematic circuit diagram illustrating two parallel coupled low noise amplifier circuits coupled to a programmable degeneration component according to one embodiment of the disclosure.

FIG. 4 illustrates the two LNA circuits 40 and 42 in greater detail according to one embodiment of the disclosure. Each LNA can be constructed identically in one embodiment, and include two NMOS transistors 50 and 52 that are capacitively coupled to a respective portion of the differential RF input signal (RFin, RFin_x) 44 through capacitors 54 and 56. The capacitors 54 and 56 operate in one embodiment as a high pass filter, and allow the RF portion thereof to pass through to the gate terminals of the NMOS transistors 50 and 52. Such capacitors 54 and 56 may be removed in an alternative embodiment. Each LNA 40 and 42 also includes a bias voltage circuit that includes a bias input terminal 58 coupled to the gate terminals of the NMOS transistors 50 and 52 via resistors 60. The voltage applied to the bias input terminal 58 sets the DC operating point about which RF input signal varies. In the above manner each LNA operates as a transconductance amplifier in which a small voltage variation (the RF input signal) at the gate terminals of the transistors 50 and 52 is converted into a substantially wide variation in current in the drain-source current path of the device, based on the gain of the transistors 50 and 52.

The transistors 50 and 52 of each LNA 40 and 42 have outputs at their respective drain terminals that couple to a respective mixer. Such coupling can be performed in various ways and all such variations are contemplated as falling within the scope of the present disclosure. In one embodiment the drain terminals are directly connected to the mixers; alternatively, the drain terminals may be series-connected to another transistor to form a cascode stage. In another alternative, the drain loads can be resistors, inductors or programmable transformers, as may be desired. The source terminals of the transistors 50 and 52 of each LNA 40 and 42 is connected to the programmable degeneration component 49. As highlighted above, based upon the operating mode of the receiver portion 30, the programmable degeneration component 49 exhibits a unique performance characteristic that operates to maintain the input impedance looking into the LNAs 40 and 42 substantially the same, independent of the operating mode.

In one embodiment using a programmable transformer at the load may have the following advantages. When implementing the RF splitter, if one implements the load with a transformer, two transformers in total are needed; one for the first LNA, and one for the second LNA. Employing two transformers costs additional chip area, and to avoid this additional area, one can utilize the transformer of a neighbor LNA, which is actually designed for another frequency band. However, if the transformers are programmable transformers, one can tune the resonance frequency of this neighbor transformer to the desired frequency range, and switches can be employed to switch the transformers between different LNA cores.

As highlighted above, the receiver portion 30 is configured to operate in at least two, different operating modes. In the first operating mode, solely the first LNA 40 is active, while the second LNA 42 is deactivated. FIG. 5a is a circuit schematic diagram illustrating one embodiment in which the LNA 42 may be deactivated. At the drain terminals of the transistors 50 and 52 a cascode circuit arrangement 70 is coupled thereto. The cascode arrangement 70 includes transistors 72 and 74 that are series-connected to transistors 50 and 52, respectively. The gate terminals of the cascode transistors 72 and 74 are coupled to a switching arrangement 76 that is configured to switch the gate terminal of the transistors 72 and 74 between a reference voltage Vref and ground, for example, to selectively turn on or off the respective cascode transistor based on the state of the mode control signal.

Therefore in the first operating mode, the mode control signal switches the gate of the cascode transistors 72 and 74 to a ground potential or any other potential that turns off the transistors 72 and 74, thereby disconnecting the LNA 42 from the respective mixer coupled thereto via the cascode stage 70. Likewise, in the second operating mode, the mode control signal switches the gate terminals of the cascode transistors 72 and 74 to a reference potential Vref that ensures that the cascode transistors 72 and 74 are turned on. Consequently, with the cascode transistors 72 and 74 on, the LNA 42 is coupled to the respective mixer for down-conversion of the amplified current signal at the drain terminals of the LNA transistors 50 and 52.

The switching arrangement of FIG. 5a for the cascode arrangement 70 may be performed in various different ways, and all such alternatives are contemplated as falling within the scope of the present disclosure. For example, in one embodiment, the mode control signal may be connected directly to the gates of the cascode transistors 72 and 74, or directly coupled to such transistors through an inverter. FIG. 5b illustrates one embodiment as a further non-limiting example. In FIG. 5b, one of the cascode transistors 72 and 74 is coupled to a node 77 between a series arrangement of a transistor 78 and a pull-up resistor 80. The gate of the transistor 78 is coupled to the mode control signal directly, in one example. If the mode control signal is high, the transistor 78 turns on, and pulls the node 77 low, thereby turning off the cascode transistors 72 and 74. Alternatively, if the mode control signal is low, the transistor 78 is off, and the lack of current causes the pull-up resistor 80 to pull the node 77 up to a reference voltage that ensures the cascode transistors 72 and 74 turn on. Other alternatives may be further employed. For example, an inverter may be used depending on the state of the mode control signal, or a PMOS device may be employed in place of the transistor 78, and all such variations are contemplated as falling within the scope of the present disclosure.

Figure 6B:
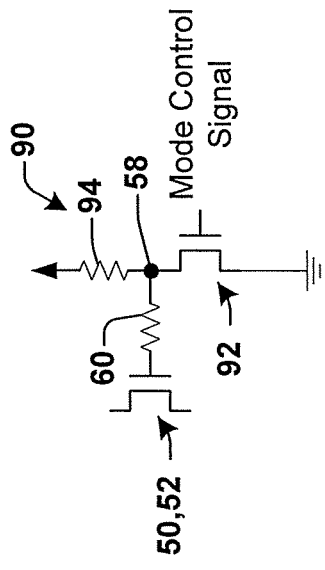
FIG. 6b is a schematic circuit diagram illustrating a switching circuit for activating and deactivating an LNA via a DC bias input terminal according to one embodiment of the disclosure.
Figure 6A:
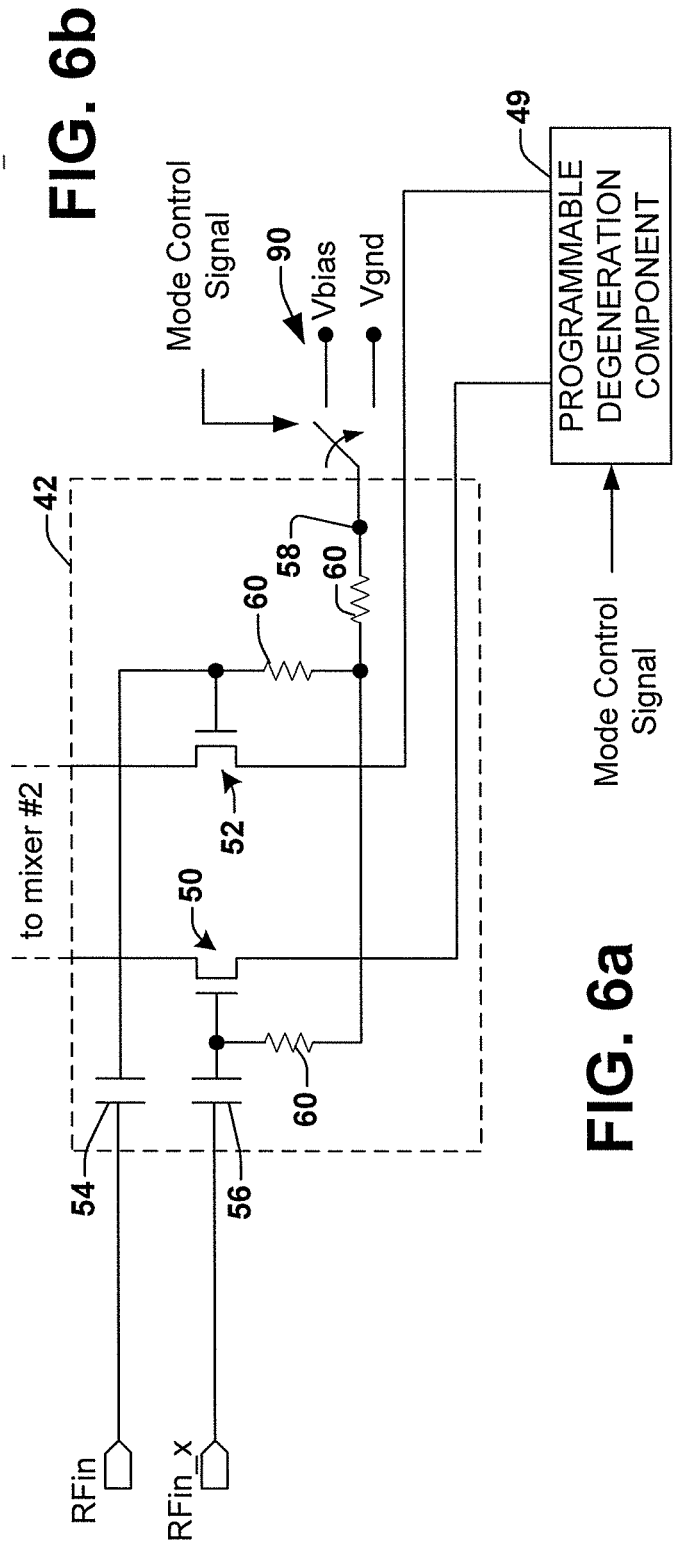
FIG. 6a is a schematic circuit diagram illustrating one of the low noise amplifier circuits of FIG. 4 having a switchable bias voltage circuit coupled thereto that illustrates how a switching thereof can be employed to deactivate the low noise amplifier according to one embodiment of the disclosure.

FIG. 6a illustrates another embodiment of how one of the LNAs may be alternately activated or deactivated to place the receiver portion or RF splitter 30 into one of the two different operating modes. FIG. 6a illustrates an LNA 42 having the gate terminal of each transistor 50, 52 coupled to a switching circuit 90 at the bias input terminal 58 that is configured to selectively couple the gate of the transistors 50, 52 to one of a bias voltage Vbias or a circuit ground potential, for example, based on a state of the mode control signal. Therefore in a first operating mode the switching circuit 90 couples the gate terminals of transistors 50, 52 to ground, thus deactivating the LNA 42 when the mode control signal dictates the first operating mode. Alternatively, in the second operating mode the switching circuit 90 couples the gate terminals of transistors 50, 52 to the bias voltage Vbias, which turns on the transistors 50, 52 and also sets the desired DC operating point of the LNA 42.

The switching circuit 90 of FIG. 6a may be configured in numerous ways, and all such alternatives are contemplated as falling within the scope of the present disclosure. FIG. 6b illustrates one non-limiting example as one embodiment. In FIG. 6b the switching circuit 90 has a series arrangement of a transistor 92 and a pull-up resistor 94 connected together at the node 58. The node 58 is connected to the gates of the LNA transistors 50, 52 via the resistor 60. When the mode control signal is high the transistor 92 pulls the node 58 down to a circuit ground potential, for example, thereby turning off the transistors 50, 52, which turns off the LNA 42. Alternatively, when the mode control signal is low, the transistor 92 is off, and the lack of current causes the pull-up resistor 94 to pull the node 58 up to the bias voltage Vbias, thereby coupling Vbias to the gates of the transistors 50, 52, which turns on the LNA 42 and sets the DC bias point.

As has been highlighted above, the programmable degeneration component 49 is configured to exhibit a programmable performance characteristic, for example, a first performance characteristic in a first operating mode and a second, different performance characteristic in a second operating mode. The differing performance characteristics for the two different operating modes operate to provide a substantially constant input impedance for the RF splitter circuit 30 thus providing a good noise figure and linearity for both modes. In one embodiment the performance characteristic comprise a programmable degeneration inductance. In another embodiment the performance characteristic comprises a programmable bias current. In yet another embodiment the performance characteristic comprises both a programmable degeneration inductance and a programmable bias current.

Figure 7:
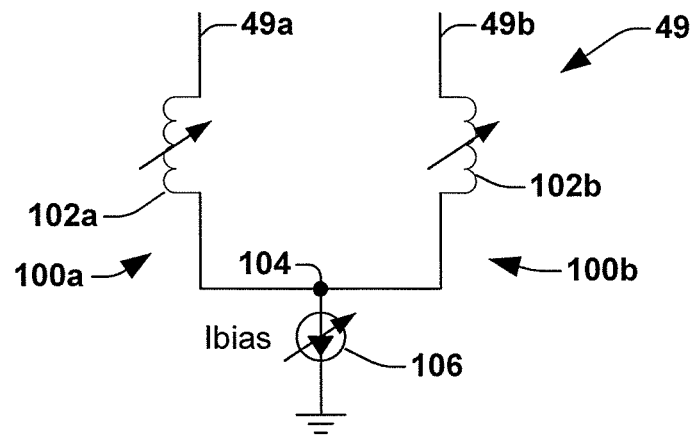
FIG. 7 is a schematic circuit diagram illustrating the programmable degeneration component that may be employed in the receiver portion of FIG. 4 according to one embodiment of the disclosure.

FIG. 7 illustrates a programmable degeneration component 49 according to one embodiment of the disclosure. In reference to FIGS. 4 and 7, the programmable degeneration component 49 has differential input terminals 49a and 49b that are associated with the transistors 50, 52 of the LNAs, respectively. In each differential path 100a, 100b resides a variable or programmable inductance 102a, 102b that varies between a first value and a second value based on the state of the mode control signal (i.e., whether the first or second operating mode). The differential paths 100a, 100b meet together at a node 104 that couples to a variable or programmable current source 106. The variable or programmable current source 106 is configured to provide a first bias current or a second, different bias current based on the state of the mode control signal (i.e., whether in the first or second operating mode). Thus as can be seen in FIG. 7, the programmable degeneration component 49 is configured to provide a differing performance characteristic by varying both the inductance and the bias current as a function of the desired operating mode.

Figure 8:
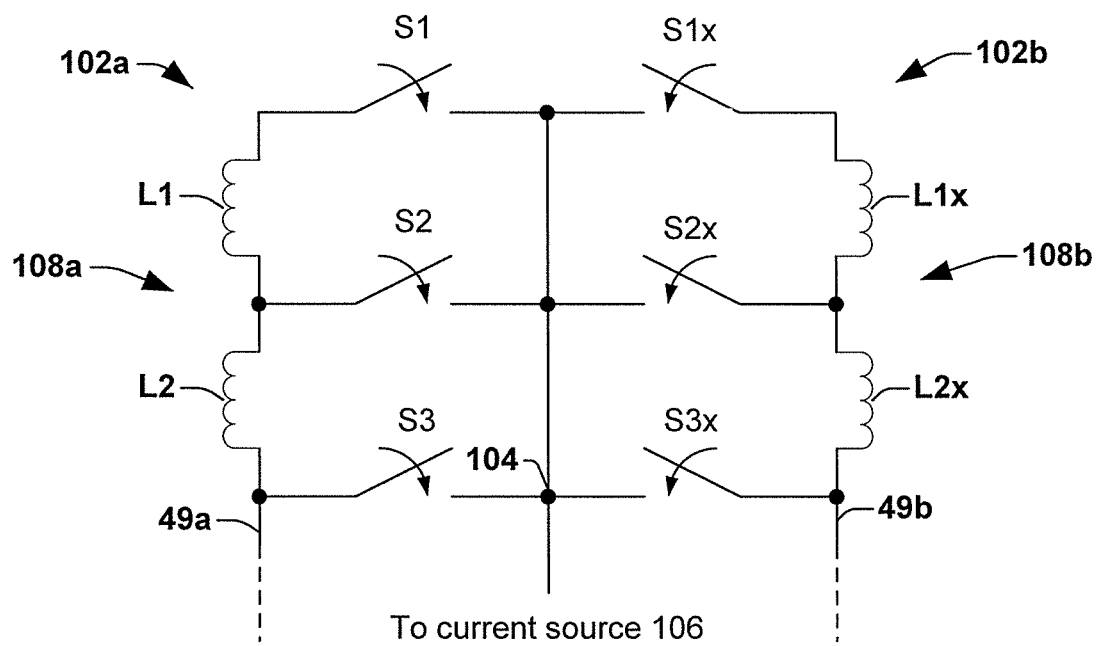
FIG. 8 is a schematic circuit diagram illustrating an array of inductances and switches that may be operated together according to a control word to program a desired inductance value for the programmable degeneration component illustrated in FIGS. 4 and 7, respectively, according to one embodiment of the disclosure.

FIG. 8 illustrates an array of inductances and switches that operate to provide a programmable or variable inductance 102a, 102b according to one embodiment of the disclosure. As illustrated, the programmable inductance comprises a center tap 104 that is selectively coupled to two series-connected inductor ladders 108a and 108b. Each node between the inductors is coupled to the center tap 104 via a switch (e.g., S1, S1x), such that upon receipt of a control word that is a function of the mode control signal, select switches close, and the circuit exhibits a particular inductance value. For example, in one mode of operation switches S1, S1x, S3 and S3x are closed, wherein each ladder 108a, 108b exhibits an inductance of L1+L2 and L1x+L2x, respectively. Likewise, in another mode of operation switches S2, S2x, S3 and S3x are closed and each ladder 108a, 108b exhibits an inductance of L2 and L2x, respectively. As may be appreciated, the ladder and switches may be extended to accommodate more than two nodes and such alternatives are contemplated as falling within the scope of the present disclosure. As can be seen from FIG. 8, based on the mode control signal the variable inductance is operable to vary between two different inductance values. It should be noted that the array of inductances can be replaced with an array of resistances in another embodiment.

Figure 9:
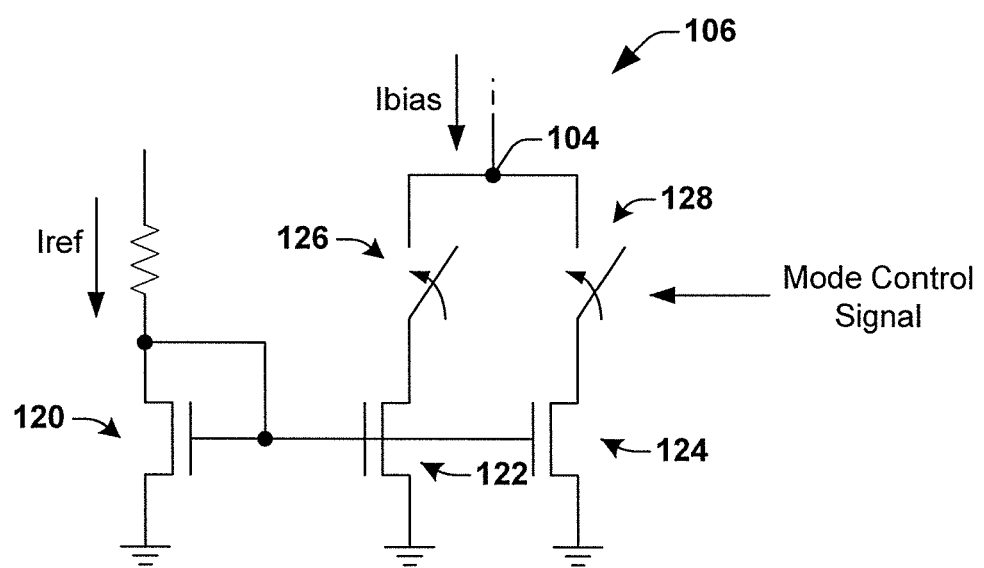
FIG. 9 is a schematic circuit diagram illustrating a programmable current mirror circuit that may be employed as a programmable current source in the programmable degeneration component of FIGS. 4 and 7, respectively according to one embodiment of the disclosure.

Turning to FIG. 9, a variable current source 106 is illustrated according to one embodiment of the disclosure that may be employed within the programmable degeneration component 49 of FIGS. 4 and 7. Macroscopically, the variable or programmable current source 106 is configured to provide different bias currents Ibias based on a state of the mode control signal. The variable current source 106 comprises a current mirror circuit having a reference current Iref through a transistor 120 that is mirrored over to one or more parallel-connected transistors 122 and 124 that are selectively coupled together via switches 126 and 128, respectively. The switches 126 and 128 are selectively activated by a mode control signal, wherein in one mode solely switch 126 is closed while in another mode both switches 126 and 128 are closed. By closing or opening the switches 126 and 128 the current mirror ratio is changed by effectively altering the "size" of the mirrored transistors. Thus in one example, if transistors 120, 122 and 124 are all the same size (e.g., W/L), Ibias=Iref in one operating mode (just one of transistors 122 and 124 connected), and Ibias=2×Iref in another operating mode (with both transistors 122 and 124 connected). As may be appreciated, the sizes of the various transistors 120, 122 and 124 may be varied to accommodate various current relationships, as may be desired. In another embodiment, the switch 126 may be eliminated, leaving transistor 122 always connected and leaving transistor 124 as the only transistor able to be selectively connected or disconnected for different operating modes. Further, for additional modes, other transistors and switches may be added.

Returning to FIG. 4, and referencing FIG. 4 in conjunction with FIGS. 7-9, the RF splitter or receiver portion 30 is configured to operate in one of two operating modes, wherein in the first operating mode LNA 40 is active while LNA 42 is deactivated by the mode control signal. As illustrated in FIGS. 5a, 5b, 6a and 6b, LNA 42 may be deactivated by deactivating a cascode stage 70 associated therewith, or by coupling a bias terminal 58 to a deactivation potential such as circuit ground. Concurrently with the deactivation of LNA 42 for the first operating mode, the programmable degeneration component 50 is set to a first performance characteristic. In one embodiment, the first performance characteristic comprises a first inductance value and a first bias current value. For example, the programmable inductance of FIGS. 7-8 is programmed to its largest value while the bias current Ibias of FIGS. 7 and 9 is programmed to its smallest value. In the first operating mode no RF signal splitting is performed.

Still referring to FIG. 4, in the second operating mode, RF signal splitting is required and both LNA 40 and LNA 42 are activated. For example, the LNAs 40, 42 can be activated by turning on a respective cascode stage (FIGS. 5a-5b) if one is present, or by coupling a bias terminal 58 of the LNAs 40, 42 to a DC bias set point potential (FIGS. 6a-6b). Concurrently, in the second operating mode, the programmable degeneration component 49 provides a second performance characteristic that differs from the first performance characteristic. As illustrated in FIGS. 7-9 the second performance characteristic may comprise a second degeneration inductance value and a second bias current value. In the second operating mode, the programmable degeneration inductance is varied to its lowest value, while the bias current is varied to its highest level. The inductance and bias current values are advantageously selected to provide an input impedance looking into the LNAs 40, 42 that is substantially the same for both the first and second operating modes.

In another alternative embodiment of the present disclosure one or more of the various modes may comprise submodes of operation. For example, in the first operating mode, a single LNA is active. Within that first operating mode, a first sub-mode and a second sub-mode of operation can exist. In such case, the first sub-mode would operate as highlighted above while the second sub-mode operates as a current save mode when a signal power level exceeds a predetermined threshold. In such case, the degeneration inductance can be further increased and the bias current further decreased. While typically such further alteration in the degeneration characteristics may lead to an undesirable increase in noise, if the signal power level is sufficiently high such noise may be deemed acceptable for the further benefit of reduced bias current and thus lower power consumption. Therefore in the first operating mode dictated by a mode select signal, further sub-modes may be selected based on other criteria such as signal power, and both signals are combined to select the desired degeneration characteristics.

Figure 10:
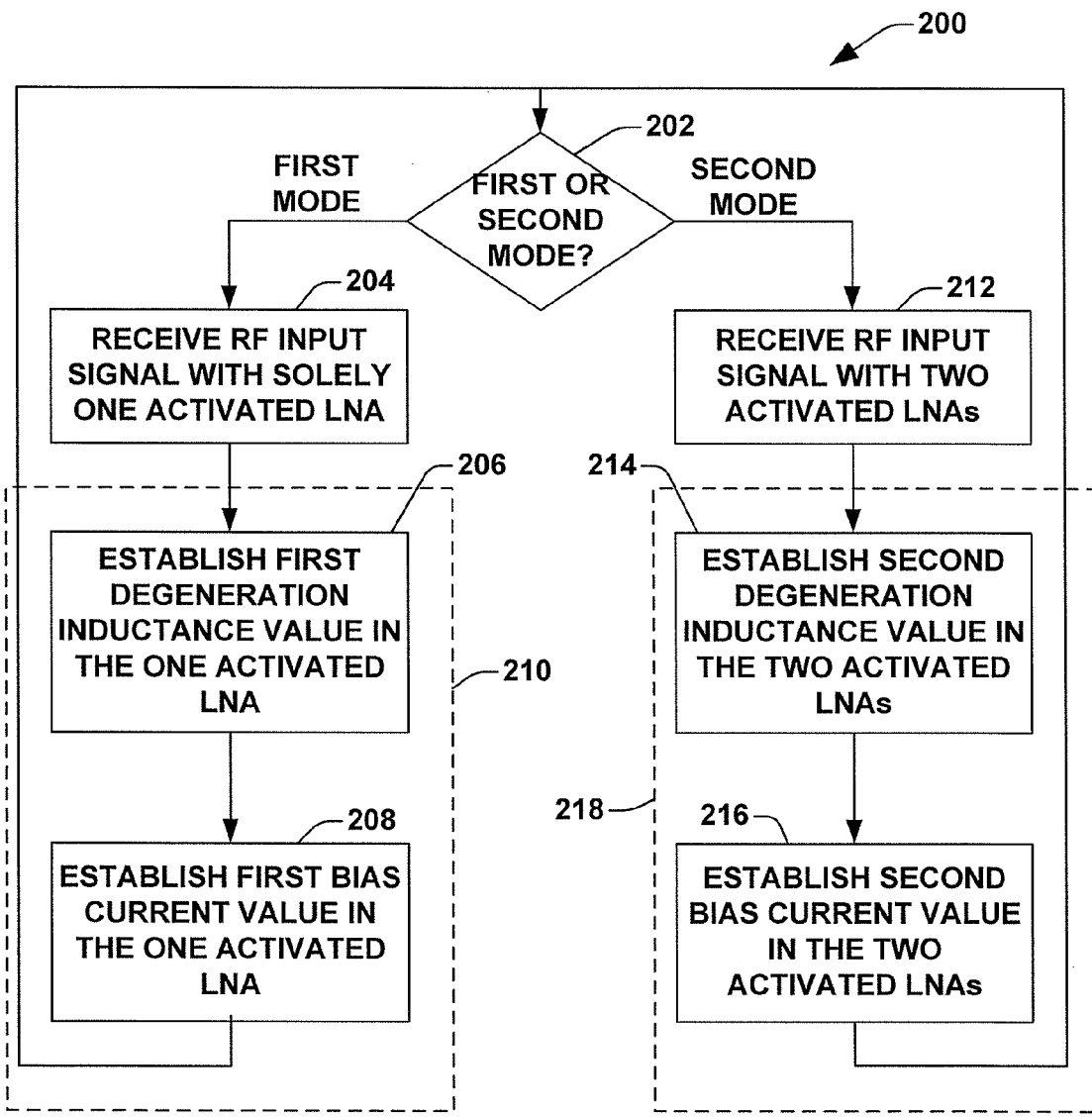
FIG. 10 is a flow chart diagram illustrating a method of receiving an RF signal involving a receiver having a plurality of parallel low noise amplifier circuits according to one embodiment of the disclosure.

Turning now to FIG. 10, a method 200 of receiving an RF signal using an RF splitter is provided. While the above method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

The method 200 begins at 202 where a determination is made whether the RF splitter is operating in a first mode or a second mode. One example of an RF splitter that may be employed in the method 200 is illustrated in FIG. 4. One non-limiting way of making such a determination is a state of a mode control signal. If the determination at 202 is that the system is in a first mode of operation, the method 200 proceeds to 204, wherein the RF input signal is received at solely one activated LNA. In one embodiment this is accomplished by deactivating all other parallel-coupled LNAs except for the one desired LNA. Such operation can be performed in one embodiment using the mode control signal, for example, wherein a cascode stage associated with deactivated LNAs can be turned off (see, e.g., FIGS. 5a-5b) or by setting a DC bias set point terminal of the deactivated LNAs to a deactivation potential (e.g., ground, FIGS. 6a-6b), or both.

The method 200 continues in the first operating mode at 206, wherein the activated LNA has a first degeneration inductance value set therein. Further, a first bias current value is established for the activated LNA that is associated with the first operating mode at 208. In one embodiment such values can be established by switching programmable circuits in accordance with the mode control signal, for example, as illustrated in FIGS. 7-9. The first degeneration inductance value at 206 and the first bias current value at 208 together provide an established first performance characteristic 210 of the RF splitter that establishes an input impedance that provides for a good noise figure and linearity of the LNA in the first operating mode.

Returning to the determination at 202, if the RF splitter is to operate in the second operating mode, two of the parallel-coupled LNAs are activated at 212, for example, by turning on a cascode stage associated therewith, if any (see, e.g., FIGS. 5a-5b), or setting a DC bias set point of the LNAs to an activation potential (see, e.g., FIGS. 6a-6b), or both. A second degeneration inductance value for the two LNAs is then established at 214, followed by a second bias current value for the LNAs at 216. Together, the second degeneration inductance value and the second bias current value represent a second performance characteristic value for the RF splitter at 218 that is different than the first performance characteristic value at 210. The second performance characteristic value is set in one embodiment to provide an input impedance for the two LNAs that is substantially the same as that of the single LNA in the first operating mode. In the above manner, in both modes, a good noise figure and linearity is established.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A dual mode receiver, comprising:
an RF splitter configured to operate in two modes, wherein the RF splitter comprises a first low noise amplifier and a second low noise amplifier, wherein the second low noise amplifier is configured to be selectively activated and deactivated in response to a mode control signal, wherein in a first mode the first low noise amplifier is active to receive an RF input signal, and in a second mode the first and the second low noise amplifiers are active to receive the RF input signal;
a programmable degeneration component operably coupled to the RF splitter and operable to provide a first performance characteristic in the first mode, and a second, different performance characteristic in the second mode, wherein the first and second performance characteristics influence an input impedance of the RF splitter to be substantially the same in the first and second modes,
wherein the second low noise amplifier comprises a cascode component at an output thereof, and wherein the cascode component is configured to be turned off to deactivate the second low noise amplifier in response to the mode control signal.

2. The dual mode receiver of claim 1, wherein the first performance characteristic comprises a first degeneration inductance and a first bias current, and the second performance characteristic comprises a second, different degeneration inductance and a second, different bias current.

3. The dual mode receiver of claim 1, wherein the second low noise amplifier comprises a bias input terminal, wherein the second low noise amplifier is configured to be deactivated when the bias input terminal receives a voltage at a first state, and activated when the bias input terminal receives a voltage at a second, different state.

4. The dual mode receiver of claim 1, wherein the programmable degeneration component comprises:
a programmable inductance; and
a programmable bias current circuitry,
wherein in the first mode the programmable inductance provides a first inductance, and the programmable bias current circuit provides a first bias current,
wherein in the second mode the programmable inductance provides a second inductance, and the programmable bias current circuit provides a second bias current, and
wherein the first inductance is greater than the second inductance and the first bias current is less than the second bias current.

5. The dual mode receiver of claim 4, wherein the programmable inductance comprises a plurality of inductances switchably connected together via a plurality of switches, wherein a section of two of the plurality of switches to be activated dictates a total inductance of the programmable inductance, and wherein the selection of the two switches is dictated by a control word that is based on a selection of the first mode or the second mode.

6. The dual mode receiver of claim 4, wherein the programmable bias current circuitry comprises a programmable current mirror circuit configured to generate a plurality of different bias current values based on a control word that is based on a selection of the first mode or the second mode.

7. An RF splitter circuit, comprising:
a first amplifier circuit configured to receive an RF input signal;
a second amplifier circuit configured to receive the RF input signal; and
a programmable degeneration component having a performance characteristic associated therewith operably coupled to the first and second amplifier circuits, and configured to alter the performance characteristic based on whether one or both of the first and second amplifiers circuits are activated, thereby maintaining a substantially constant input impedance despite whether one or both of the first and second amplifiers are activated,
wherein the first and second amplifier circuits each comprise a cascode stage coupled to an output thereof, and wherein each of the first and second amplifier circuits is configured to be selectively deactivated when a respective cascode stage is turned off.

8. The RF splitter circuit of claim 7, wherein the performance characteristic comprises a degeneration inductance.

9. The RF splitter circuit of claim 7, wherein the first and second amplifier circuits each comprise a bias input terminal configured to deactivate the respective amplifier circuit when a predetermined potential is provided thereto.

10. The RF splitter circuit of claim 7, wherein the programmable degeneration component comprises a programmable degeneration inductance comprising a first inductance value when solely one of the first and second amplifier circuits is activated, and a second, different inductance value when both the first and second amplifier circuits are activated.

11. The RF splitter circuit of claim 10, wherein the first inductance value is greater than the second inductance value.

12. The RF splitter circuit of claim 10, wherein the programmable degeneration inductance comprises a plurality of series-connected inductances selectively coupled to a center tap via a respective switch, and wherein a state of the switches dictates an inductance value of the programmable degeneration inductance.

13. The RF splitter circuit of claim 10, wherein the programmable degeneration component further comprises a programmable current bias circuit comprising a programmable current mirror circuit configured to provide a first bias current when solely one of the first and second amplifier circuits is activated, and a second, different bias current when both the first and second amplifier circuits are activated.

14. The RF splitter circuit of claim 13, wherein the first bias current is less than the second bias current.

15. A method of receiving an RF signal involving a receiver having a plurality of parallel low noise amplifier circuits, comprising:
ascertaining a mode of operation associated with an RF input signal;
receiving the RF input signal with solely one of the plurality of parallel low noise amplifier circuits based on the ascertained mode of operation when the ascertained mode of operation is a first mode;
receiving the RF input signal with the plurality of parallel low noise amplifier circuits based on the ascertained mode of operation when the ascertained mode of operation is a second mode; and
altering a performance characteristic of a programmable degeneration component operably coupled to the plurality of parallel low noise amplifier circuits based on the ascertained mode of operation,
wherein a first low noise amplifier of the plurality of low noise amplifiers comprises a cascode component at an output thereof, and wherein the cascode component is configured to be turned off to deactivate the first low noise amplifier in response to the mode control signal.

16. The method of claim 15, wherein altering the performance characteristic comprises establishing a first degeneration inductance value of the programmable degeneration component when solely one of the parallel low noise amplifier circuits is activated, and establishing a second degeneration inductance value when the plurality of parallel low noise amplifier circuits are active, wherein the first degeneration inductance value is greater than the second degeneration inductance value.

17. The method of claim 16, wherein altering the performance characteristic further comprises establishing a first bias current value of the programmable degeneration component when solely one of the parallel low noise amplifier circuits is active, and establishing a second bias current value of the programmable degeneration component when the plurality of parallel low noise amplifier circuits are active, wherein the first bias current value is less than the second bias current value.

* * * * *